United States Patent [19]

Kimura

[11] Patent Number: 5,019,819
[45] Date of Patent: May 28, 1991

[54] DIGITAL-TO-ANALOG CONVERSION CIRCUIT

[75] Inventor: Shigenobu Kimura, Hamamatsu, Japan

[73] Assignee: Yamaha Corporation, Hamamatsu, Japan

[21] Appl. No.: 514,859

[22] Filed: Apr. 26, 1990

[30] Foreign Application Priority Data

May 2, 1989 [JP] Japan .................................. 1-113262

[51] Int. Cl.$^5$ .......................... H03M 3/00; H03M 1/66
[52] U.S. Cl. .................................... 341/143; 341/137; 341/144
[58] Field of Search ............... 341/137, 143, 144, 118, 341/145–154, 200; 375/25–34

[56] References Cited

U.S. PATENT DOCUMENTS

| | | | |
|---|---|---|---|
| 3,566,396 | 2/1971 | Paine | 341/137 |
| 3,836,907 | 9/1974 | Nercessian | 341/137 |
| 4,053,734 | 10/1977 | Yasunaga | 341/137 |
| 4,617,551 | 10/1986 | Ophoff | 341/137 |

Primary Examiner—A. D. Pellinen
Assistant Examiner—Sharon D. Logan
Attorney, Agent, or Firm—Spensley Horn Jubas & Lubitz

[57] ABSTRACT

A digital-to-analog conversion circuit capable of preventing a noise produced in a digital system from mixing in an analog output has an input circuit receiving a pulse-code modulated digital signal, a conversion circuit such as a noise shaping circuit for converting the pulse-code modulated digital signal to a pulse wave signal containing analog amplitude information in a time axis direction, a buffer circuit including an electrically insulated coupling circuit such as an optical coupling circuit for transmitting output of the conversion circuit, and an analog output circuit including an analog low-pass filter for delivering out output of the buffer circuit therethrough. A noise generated in a digital system is intercepted by the buffer circuit and is not transmitted further so that mixing of the noise in the analog output circuit is prevented.

10 Claims, 5 Drawing Sheets

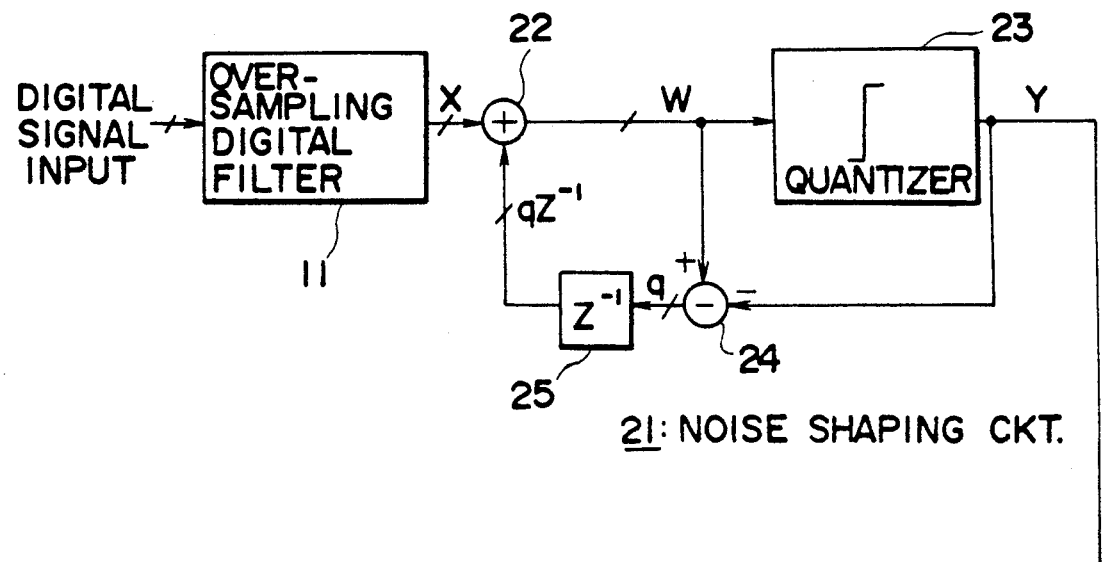
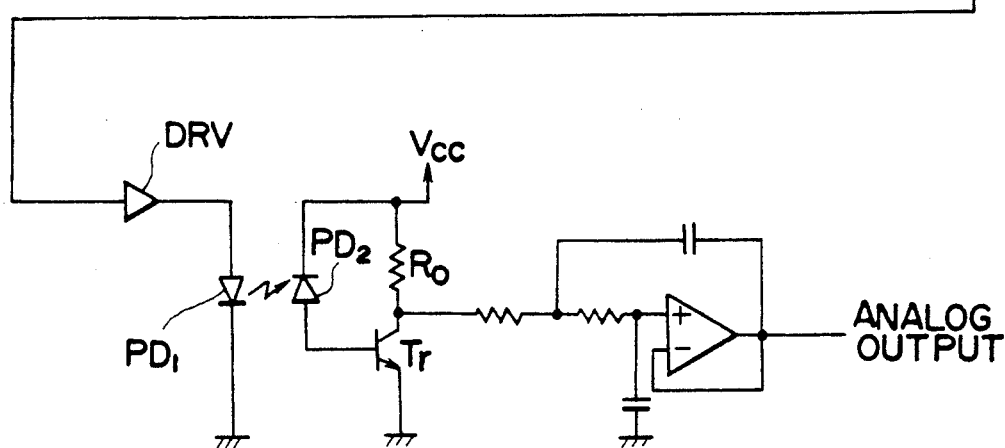
F I G. 1
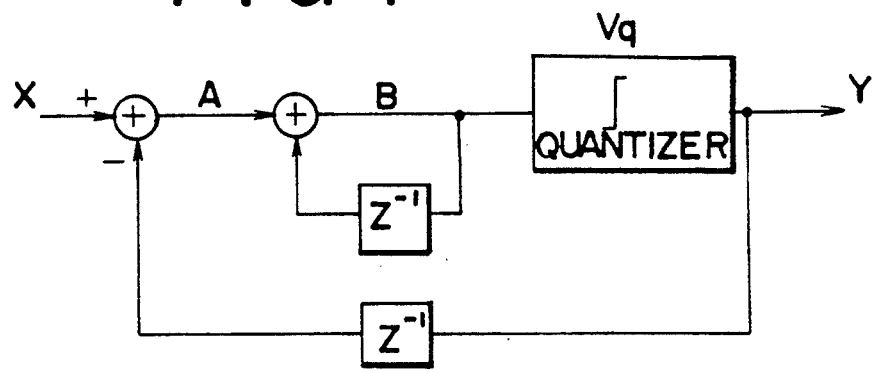
F I G. 2

FIG. 3a  ORIGINAL ANALOG SIGNAL 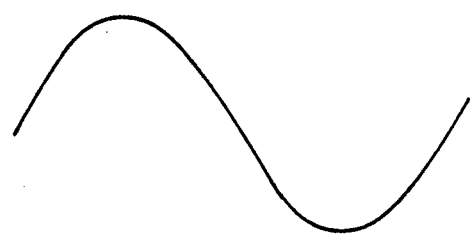
FIG. 3b  X 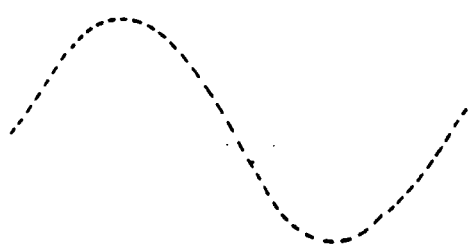
FIG. 3c  Y 
FIG. 3d  OUTPUT OF LPF 32 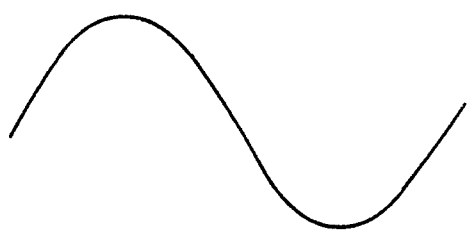

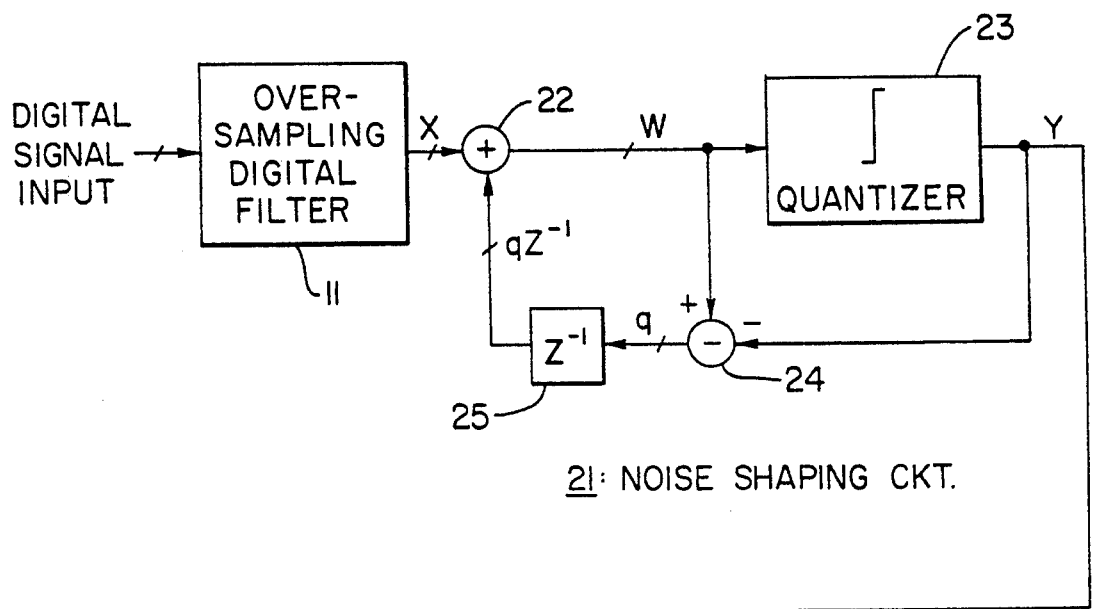
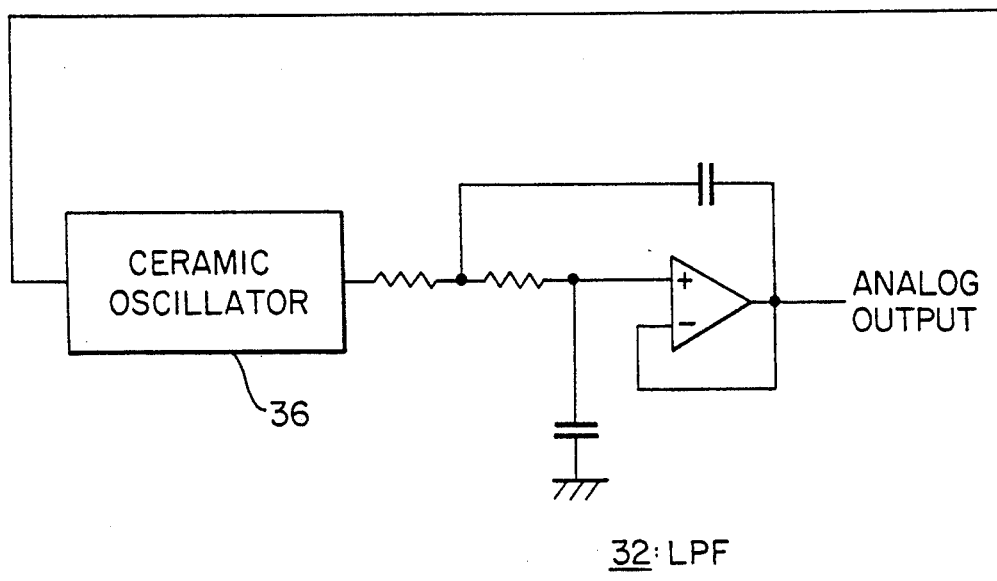
FIG. 6

DIGITAL-TO-ANALOG CONVERSION CIRCUIT

BACKGROUND OF THE INVENTION

This invention relates to a digital-to-analog conversion circuit capable of preventing a noise produced in a digital signal system from mixing in an analog output.

In a digital-to-analog conversion, in order to obtain an analog signal of high quality, some process is needed to prevent a noise produced in a digital signal system on an input side from mixing in an analog signal system on an output side. FIG. 4 shows a digital-to-analog conversion circuit which employs means for preventing mixing of a noise.

In FIG. 4, digital data DATA to be digital-to-analog converted is provided serially and sequentially from a digital signal processsesing circuit 1 in synchronism with a bit clock BCK. Also, from the digital signal processing circuit 1, a word clock WCK is provided every time the digital data DATA for one word is provided. The digital data DATA, the bit clock BCK and the word clock WCK are applied to an optical coupling circuits 2a, 2b and 2c respectively.

The optical coupling circuit 2a consists of a driver DRV, a light-emitting diode PD, which emits light by being driven by an output of the driver DRV, a photo-transister PT to detect an output of the light-emitting diode PD and its load resistance RL. When an input signal is "1", an output from the driver DRV is "1" so that the light-emitting diode PD emits light and the photo-transister PT is turned on to produce a signal "0". To the contrary, if an input signal is "0", the light emitting diode PD does not emit light and the photo-transister PT is turned off to produce a signal "1". The other two optical coupling circuits 2b and 2c have the same construction as that of the optical coupling circuit 2a.

The digital data DATA is applied through the optical coupling circuit 2a to the shift register 3, whereas the bit clock BCK is supplied through the optical coupling circuit 2b as a clock. Then the digital data DATA is written sequentially in a shift register 3. On the other hand, every time the digital data DATA is produced for one word, the word clock WCK synchronized therewith is suppled through the optical coupling circuit 2c to a latch circuit 4 as a latch signal. The digital data DATA stored in the shift register 3 is loaded in the latch circuit 4. Then, each bit output of the latch circuit 4 is supplied in an R-2R ladder circuit 5. The R-2R ladder circuit 5 consists of resistors R, R, ... which have a predetermined resistance value and resistors 2R, 2R, ..., which have double resistance value that of the reisitors R, R, ... and switches SW, SW, ..., which switch connections of the resistors 2R, 2R, .... Each bit output of the latch circuit 4 is supplied to the respective switches SW, SW, ... as a switching signal, and the respective switches SW, SW, ... are switched, if a related bit output is "0", so that the resistor 2R is connected to the ground, and, if the bit output is "1", so that the resistor 2R is connected to the output side of the circuit. In this case, the output of the R-2R ladder circuit 5 is in a virtually grounded state due to provision of a posterior inverting amplifier 6. The virtually grounded state will be described later.

At each of branching points A1, A2, ... An in the R-2R ladder circuit 5, the resistance value on the side of the resistor 2R, and the resistance value on the side of the resistor R (direction of F) seen respectively from each branching point are both 2R. Accordingly, at each of the branching points A1, A2, ..., An, a flowing current is divided into two currents, namely one flowing on the side of 2R and the other flowing on the side of R. When an output current of a voltage source VR is represented by I, currents which flow from the respective branching points A1, A2, ... An, through the resistors 2R, 2R, are I/2, I/4, I/8, ..., respectively. These currents, if a corresponding bit output value of the latch circuit 4 is "1", are selected and provided through the switches SW, SW, .... In this manner, currents corresponding to output values of the latch circuit 4 are generated, and applied to the posterior inverting amplifier 6.

This inverting amplifier 6 comprises an operational amplifier 6a, a resistor r1 and a resistor r2. A non-inverting input terminal of the operational amplifier 6a is grounded through a resistor r2, and a resistor r1 is inserted between an output terminal and the non-inverting input terminal. The operational amplifier 6a is operated so that potential of the inverting input terminal keeps ground potential (i.e., the above described virtually grounded state). Then, the output current from the R-2R ladder circuit 5 flows through the resistor r1, and voltage corresponding to this current is delivered from the operational amplifier 6a.

In this manner, the digital data DATA delivered from the digital signal processing circuit 1 is provided after being digital-to-analog converted. Since the shift resister 3 and the latch circuit 4 are electrically insulated from the digital signal processing circuit 1 by optical coupling circuit 2a, 2b and 2c, even if a noise is generated in the digital signal processing circuit 1, it deos not mix in the analog output through the shift register 3 and the latch circuit 4.

The above described conventional digital-to-analog conversion circuit in which mixing of a noise generated in the digital signal processing circuit 1 in the analog output side can be avoided in the optical coupling circuit 2a to 2c, however, has the problem that a noise generated in the shift resister 3 posterior to the optical coupling circuits 2a to 2c and the latch circuit 4 can mix into the analog output. Also, the conventional digital-to-analog circuit has the problem that, since the phase relation between the digital data DATA, the bit clock BCK and the word clock WCK supplied to the shift register 3 and the latch circuit 4 must be kept in a normal state, the optical coupling circuits 2a to 2c must be chosen so that they have the same delay time or, alternatively, circuits which are operated with such a high speed that their delay time can be ignored must be employed as the optical coupling circuits 2a to 2c, with a result that the manufacturing cost increases, no matter which of the above alternatives is adopted. For overcoming this problem, the circuit can be so constructed that an output of the digital signal processing circuit 1 is applied directly to the shift resister 3 and the latch circuit 4 without being applied to the optical coupling circuits 2a to 2c, and the R-2R ladder circuit 5 is optically connected with the inverting amplifier 6. In this case, however, since output of the R-2R ladder circuit 5 is an analog signal, non-linear characteristics of the optical coupling element inserted affects the circuit with resulting decrease in the linearity of the entire circuit.

It is, therefore, an object of the invention to provide a digital-to-analog conversion circuit in which a noise generated in a digital signal processing system is not mixed in an analog output.

SUMMARY OF THE INVENTION

The digital-to-analog conversion circuit achieving the above object of the invention comprises input means receiving a pulse-code modulated digital signal, conversion means for converting the pulse-code modulated digital signal to a pulse wave signal containing analog amplitude information in a time axis direction, buffer means comprising electrically insulated coupling means for transmitting output of said conversion means through said electrically insulated coupling means, and analog output means comprising an analog low-pass filter for delivering out output of said buffer means through said analog low-pass filter.

According to the invention, a pulse-code modulated digital input signal is provided after being converted to a pulse wave signal containing analog amplitude information in time axis direction. This output signal is transmitted through the electrically insulated buffer and is derived by the analog output means comprising the analog-pass filter as an analog signal corresponding to the digital input signal. A noise generated in the digital signal system is intercepted by the buffer means and is not transmitted further so that mixing of the noise in the analog output is prevented. Time average of the output signal of the conversion means is proportional to the digital signal whereby a digital-to-analog conversion in high linearity can be achieved.

An embodiment of the invention will now be described with reference to the accompanying drawings.

BRIEF DESCRIPTION OF THE DRAWINGS

In the accompanying drawings,

FIG. 1 is a circuit diagram showing a structure of an embodiment of the digital-to-analog conversion circuit according to the invention;

FIG. 2 is a diagram showing an example of the operation of the noise shaping circuit 21 in the embodiment in FIG. 1;

FIGS. 3a to 3d are waveform diagrams showing waveforms generated in some circuit portions for explaining the operation of the above embodiment;

FIG. 6 is a circuit diagram of the present invention utilizing a ceramic oscillator.

DESCRIPTION OF A PREFERRED EMBODIMENT

Figure 4:
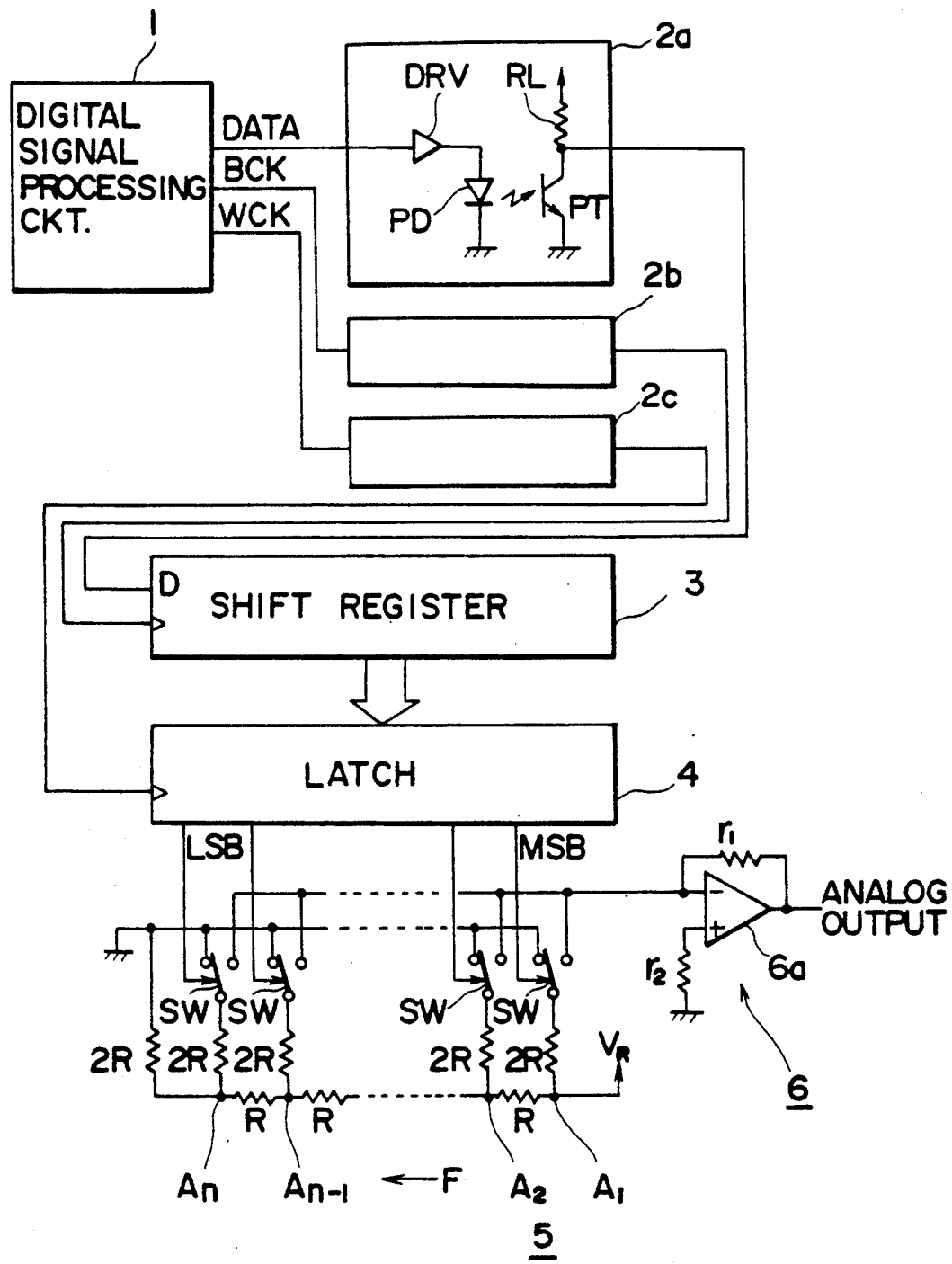
FIG. 4 is a circuit diagram showing the structure of a prior art digital-to-analog conversion circuit.

FIG. 1 shows the structure of an embodiment of the digital-to-analog conversion circuit according to the invention. This digital-to-analog conversion circuit comprises a noise shaping circuit 21 of a single stage, an optical coupling circuit 31 to transfer output of the noise shaping circuit 21 and a LPF(low-pass filter) 32 to remove a carrier of output of the optical coupling circuit 31. In the state shown in FIG. 1, an oversampling digital filter 11 is connected to the input side of the digital-to-analog conversion circuit.

Sample values obtained by sampling original analog signals at a predetermined sampling period are pulse-code modulated and applied to the oversampling filter 11 as time sequential digital signals. Then, a value at a point between the respective sample values is obtained by interpolation from the respective sample values which are continuous on a time axis, and digital data X indicating result of the calculation is sequentially provided. In this manner, for a digital input with a sampling frequency fs, digital output X with sampling frequency N·fs (N being an integer) which is n times as high as that of the digital input is obtained.

The noise shaping circuit 21 consists of an adder 22, a quantizer 23, subtracter 24 and a 1-sample delay circuit. An output of the oversampling digital filter 11 and output data of the 1-sample delay circuit 25 are added together by the adder 22, and data W derived thereby is applied to the quantizer 23 and the subtractor 24. Then, the data W is compared with a predetermined threshold value $\alpha$ by the quantizer 23. If value of the data W is larger than the threshold value $\alpha$, "1" is provided as a quantizing signal Y whereas, if the data W is smaller than the threshold value $\alpha$, "0" is provided as the quantizing signal Y. In the subtracter 24, if the quantizing signal Y is "0", $W-(-\alpha)=W+\alpha$ is provided as data q, whereas if the quantizing signal Y is "1", $W+(-\alpha)=-W-\alpha$ is provided as the data q.

The data q is delayed by one sample period by the 1-sample delay circuit 25 consisting of flip-flops of the number corresponding to bit width of the data q, and applied to the adder 22. In synchronization with transmission of one word of the data X from the oversampling digital filter 11, a sample clock is supplied to the 1-sample delay circuit 25 so that a processing for arithmetic operation is performed in the noise shaping circuit 21.

The noise shaping circuit 21 in FIG. 1 can be substituted by the construction of FIG. 2. According to the construction of FIG. 2, it is apparent that the following formulas will be established:

$$A = X - Y \cdot Z^{-1} \quad (1)$$

$$B = A + B \cdot Z^{-1} \quad (2)$$

From the formula (2), $$B(1-Z^{-1}) = A = X - Y \cdot Z^{-1} \quad (3)$$

Therefore, B can be obtained by the following formula (4):

$$B = (X - Y \cdot Z^{-1})/(1 - Z^{-1}) \quad (4)$$

If a quantizing error of the quantizer 23 is represented by Vq, $$\begin{aligned} Y &= B + Vq \\ &= (X - Y \cdot Z^{-1})/(1 - Z^{-1}) + Vq \end{aligned} \quad (5)$$

Accordingly, by solving the formula (5) with respect to Y, transfer function of the noise shaping circuit 21 can be obtained by the following formula (6):

$$Y = X + (1 - Z^{-1}) Vq \quad (6)$$

In the noise shaping circuit 21, the preceding data q held in the 1-sample delay circuit 25 and the input data X are added together by the adder 22 and the result W of the addition is quantized by the quantizer 23. If a quantizing error has occurred, this error is cumulatively added and preserved and, when sum of the data q and the input data X has exceeded the threshold value of the quantizer 23, the quantizing signal Y becomes "1" and a value corresponding to the threshold value is subtracted. Accordingly, if observed instantaneously, the quantizing signal Y is a binary data of "1" and "0" but a time average value of the quantizing signal Y coincides with the value of the input data X.

The optical coupling circuit 31 comprises a driver DRV producing a drive current based on the quantizing signal Y, a light-emitting diode PD1 driven by the driver DRV, a photo-detecting diode PD2 detecting output light of the light-emitting diode PD1, a load resistor Ro and a transistor Tr. The collector of the transistor Tr is connected to power source Vcc, its base is connected to the power source Vcc through the photo-detecting diode PD2 and its emitter is grounded. In this optical coupling circuit 31, when the quantizing signal Y is "1", the light-emitting diode PD1 emits light to turn on the photo-detecting diode PD2 which in turn causes the transistor Tr to be turned on so that the output signal becomes "0". Conversely, when the quantizing signal is "0", the light-emitting diode PD1 does not emit light and the photo-detecting diode PD2 is turned off which in turn causes the transistor Tr to be turned off so that the output signal becomes "1".

The operation of the digital-to-analog conversion circuit according to the invention will now be described. FIG. 3a shows the original analog signal waveform, FIG. 3b shows the digital signal waveform corresponding to the output data X from the oversampling digital filter 11 and FIG. 3c the quantizing signal Y from the noise shaping circuit 21, respectively. A PCM signal of, e.g., a sampling frequency fs=44.1 kHz and 16 bits (e.g., a PCM signal obtained by sampling the analog signal of FIG. 3a) provided from outside is first applied to the oversampling digital filter 11 where it is converted by an interpolation operation into data necessary for the noise shaping circuit 21 provided in a posterior stage and delivered out as the data X (e.g., one shown in FIG. 3b). In the noise shaping circuit 21, the data X is converted to a PDM (pulse-density modulation) signal (e.g., one shown in FIG. 3c) consisting of data "1" and "0" only and delivered out as the quantizing signal Y. As shown in FIG. 3, in case the value of the input data X changes as time elapses, the density of generation of the quantizing signal Y changes in accordance with the value of the data X.

This quantizing signal Y is supplied to the LPF 32 through the optical coupling circuit 31. Since the input side of the optical coupling circuit 31 is electrically insulated from its output side, a switching noise which may be generated in the oversampling filter 11 and the noise shaping circuit 21 is prevented from propagating to the LPF 32. From the LPF 32 is obtained an analog output corresponding to the data X (see FIG. 3d).

Figure 5:
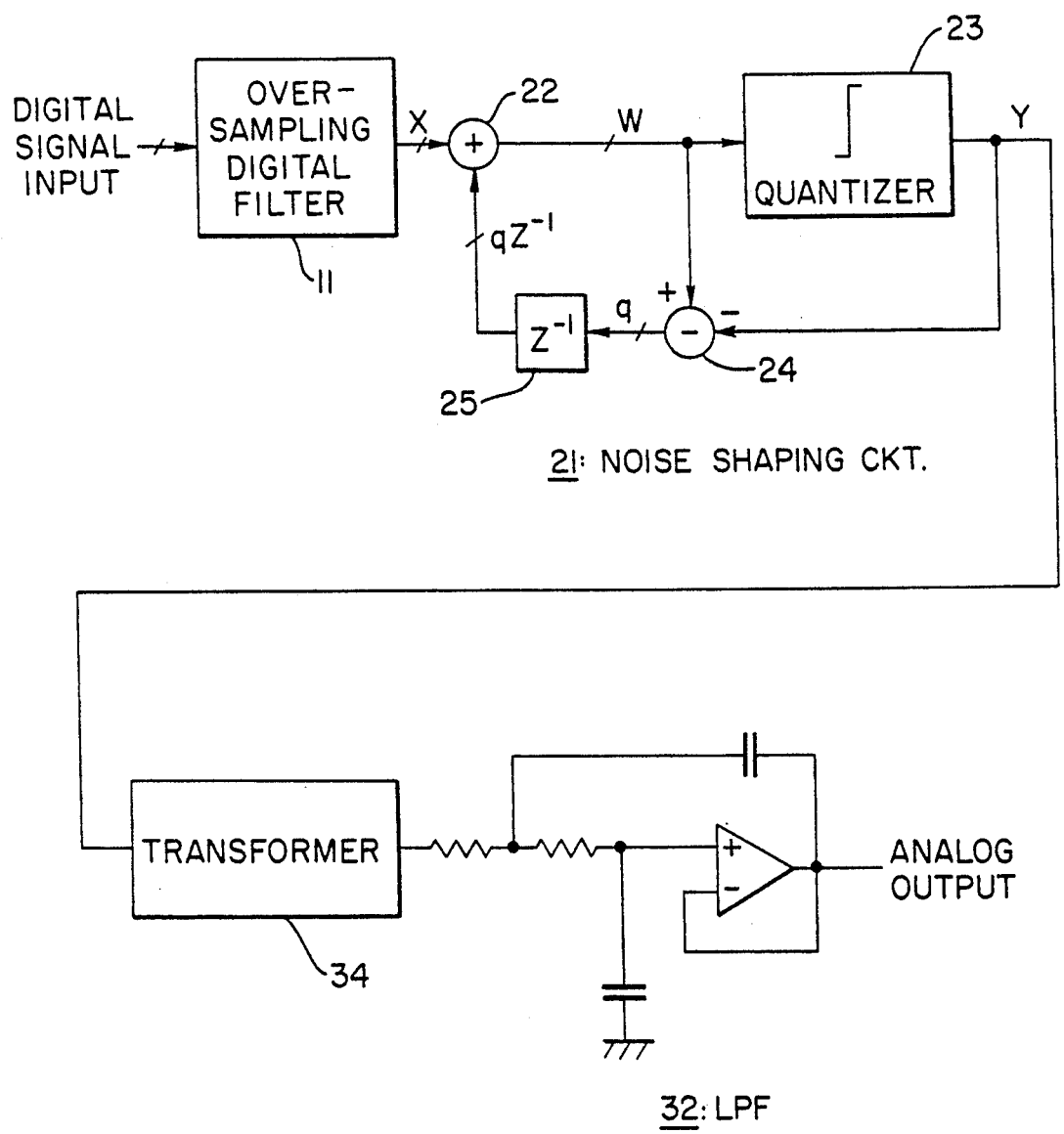
FIG. 5 is a circuit diagram of the present invention utilizing a transformer.

In the above described embodiment, signal transmission between the noise shaping circuit 21 and the LPF 32 is made through the optical coupling circuit 31. The substantially same effect can be obtained by other signal transmission means whose input side is electrically insulated from output side thereof, e.g., a transformer 34 as shown in FIG. 5 or a ceramic oscillator 36 as shown in FIG. 6. In the above described embodiment, the noise shaping circuit of one stage is employed. The signal-to-noise ratio can however be improved by employing a multi-stage type noise shaping circuit such as a two-stage circuit or a three-stage circuit. Further, in the above described embodiment, a PDM signal is obtained by employing the noise shaping circuit as the conversion means. The conversion means however is not limited to this but a non-noise shaping type circuit or other type of circuit may be utilized as the conversion means if it can produce a pulse signal containing analog information on a time axis direction by conversion of a signal. Conversion means, for example, according to which a pulse output after conversion becomes a PWM (pulse width modulation) signal may produce substantially the same effect as the above described embodiment.

What is claimed is:

1. A digital-to-analog conversion circuit comprising:
   input means receiving a pulse-code modulated digital signal;
   conversion means for converting the pulse-code modulated digital signal to a pulse wave signal containing analog amplitude information in a time axis direction;
   buffer means comprising electrically insulated coupling means for transmitting output of said conversion means through said coupling means; and
   analog output means comprising an analog low-pass filter for delivering out output of said buffer means through said analog low-pass filter.

2. A digital-to-analog conversion circuit as defined in claim 1 wherein said conversion means is a noise shaping circuit for converting the pulse-code modulated signal from said input means to the pulse wave signal.

3. A digital-to-analog conversion circuit as defined in claim 2 wherein said noise shaping circuit comprises:
   an adder receiving the pulse-code modulated signal from said input means and performing addition of the pulse-code modulated signal and a delay signal;
   a quantizer receiving output of said adder and comparing the output of said adder with a predetermined reference value to provide a quantizing signal of a binary value in accordance with result of the comparison;
   a subtracter receiving the output of said adder and the output of said quantizer for adding or subtracting a value corresponding to the reference value of said quantizer to or from the output of said adder in accordance with the quantizing signal; and
   a 1-sample delay circuit for delaying the output of said subtracter by one sampling period and supplying its output as the delay signal to said adder.

4. A digital-to-analog conversion circuit as defined in claim 2 wherein the pulse wave signal is a pulse-density moudlated signal.

5. A digital-to-analog conversion circuit as defined in claim 2 wherein said pulse wave signal is a pulse width modulated signal.

6. A digital-to-analog conversion circuit as defined in claim 1 wherein said electrically insulated coupling means is an optical coupling circuit connected on its input side to the output of said conversion means and connected on its output side to said analog output means.

7. A digital-to-analog conversion circuit as defined in claim 6 wherein said optical coupling circuit comprises;
   light emitting means for emitting light in response to the output of said conversion means; and
   light detecting means for detecting the light emitted by said light emitting means and for providing an output to said output means.

8. A digital-to-analog conversion circuit as defined in claim 7 wherein said light emitting means comprises:

a driver for producing a drive current in response to the output of said conversion means; and a light-emitting diode driven by the drive current to emit light;

and said light detecting means comprises:

a photo-detecting diode for detecting the light emitted by said light-emitting diode; and a transistor connected in its base to a power source through said photo-detecting diode, connected in its collector to the power source through a load resistor and grounded in its emitter.

9. A digital-to-analog conversion circuit as defined in claim 1 wherein asid electrically insulated coupling means is a transformer.

10. A digital-to-analog conversion circuit as defined in claim 1 wherein said electrically insulated coupling means is a ceramic oscillator.

* * * * *